(12) United States Patent
Joist et al.

(10) Patent No.: US 7,672,139 B2
(45) Date of Patent: Mar. 2, 2010

(54) SHELF FOR ELECTRONIC PLUG-IN DEVICES

(75) Inventors: Michael Joist, Gaggenau (DE); Rainer Weber, Karlsbad (DE)

(73) Assignee: Schroff GmbH, Straubenhardt (DE)

( * ) Notice: Subject to any disclaimer, the term of this patent is extended or adjusted under 35 U.S.C. 154(b) by 303 days.

(21) Appl. No.: 11/783,679

(22) Filed: Apr. 11, 2007

(65) Prior Publication Data
US 2007/0242423 A1    Oct. 18, 2007

(30) Foreign Application Priority Data
Apr. 11, 2006    (DE)    ........................ 10 2006 017 329

(51) Int. Cl.
*H05K 5/00*    (2006.01)
(52) U.S. Cl. ....................... 361/756; 361/752
(58) Field of Classification Search ................ 361/756, 361/752, 796, 730, 728, 741, 801, 802; 174/17 R, 174/50, 520, DIG. 9, DIG. 34, DIG. 35
See application file for complete search history.

(56) References Cited
U.S. PATENT DOCUMENTS 4,022,326 A * 5/1977 Marconi ................... 211/41.17
5,155,663 A * 10/1992 Harase .................. 361/679.31
5,696,668 A * 12/1997 Zenitani et al. ............. 361/802
6,980,440 B2 * 12/2005 Nieman et al. .............. 361/802
7,285,022 B2 * 10/2007 Shtargot et al. ............. 439/638

FOREIGN PATENT DOCUMENTS

| DE | 31 40730 A1 | 4/1983 |
| DE | 89 08 260 U1 | 9/1989 |
| DE | 8908260 | * 9/1989 |
| DE | 197 55 018 C1 | 2/1999 |

OTHER PUBLICATIONS

European Search Report dated Jul. 29, 2008, directed to counterpart EP 06 00 8996 application number. (4 pages).

* cited by examiner

*Primary Examiner*—Jinhee J Lee
*Assistant Examiner*—Yuriy Semenenko
(74) *Attorney, Agent, or Firm*—Venable LLP; Robert Kinberg; Leigh D. Thelen

(57) ABSTRACT

A shelf for electronic plug-in units is provided. The shelf includes at least one support plate that has at least one shaped opening. At least one guide rail is arranged for being mounted on the support plate, which includes a guide groove for receiving the electronic plug-in unit. There is also provided at least one positioning unit arranged on the guide rail, which includes a trunnion insertable form-fittingly into the shaped opening in the support plate to fix a position of the positioning unit relative to the support plate, and a locking element to lock in place an electronic plug-in unit fully inserted into the guide rail.

7 Claims, 5 Drawing Sheets

SHELF FOR ELECTRONIC PLUG-IN DEVICES

CROSS-REFERENCE TO RELATED APPLICATION

This application claims the priority of German Patent Application No. 10 2006 017 329.5, filed on Apr. 11, 2006, the subject matter of which is incorporated herein by reference.

BACKGROUND OF THE INVENTION

1. Field of Invention

The present invention relates generally to a shelf, and more particularly to a shelf for storing electronic plug-in units.

2. Description of the Related Art

The modern trend in design of electronic devices is to configure the device as plug-in modules capable of being racked in a shelf. Such plug-in modules are often provided with a multipoint connector that is plugged into a corresponding connecting strip on the back panel (i.e. the backplane) of the shelf.

In order to standardize shelf management implementation, the AMC (Advanced Mezzanine Card) Standard developed by the PICMG (PCI Industrial Computer Manufacturers Group) defines the specifications for plug-in modules and the shelves. The plug-in devices that conform to these specifications are relatively small and are provided with a front panel that is mounted on the circuit board. Such plug-in devices are fit for a special shelf, for which the size and shape are defined in the PICMG Specifications MicroTCA. A shelf of this type includes an upper and a lower support plate spaced apart by two side walls. Guide rails with guide grooves for the circuit boards are arranged on the support plates. These guide rails can be integrated into the support plates by reshaping the material of the support plates, or they can be installed as separate units make of metal or plastic on the support plates.

One special feature of a MicroTCA shelf for AMC modules is that there are no barriers to stop the front panels of the plug-in modules because the backplane of the shelf serves as the stoppage point for the back edge of the circuit boards. Instead, the AMC Standard specifies a locking mechanism, for which a locking projections on the support plate is engaged by a catch on the plug-in module. The AMC standard specifies extremely small dimensions for the locking projection.

In conventional metal support plates for MicroTCA shelves include locking projections that form upward-pointing bulges in the sheet metal plate, which has the advantage of making them extremely stable. An important disadvantage of the conventional support plates, however, is that the position of the locking projections is not flexible, meaning that either separate locking projections must be provided on the support plate for different guide rail positions, or the guide rails can be mounted only at a few predetermined positions on the support plate. Therefore, configurations with plug-in units of different widths are not possible for all practical purposes.

The aforementioned method of forming the locking projections onto the freely positioned guide rails cannot be used where the guide rails are made of plastic material because the plastic material are not nearly strong enough to withstand the mechanical stress exerted when locking a plug-in module in place. The individual arrangement of the locking projections on the support plate is thus required for a shelf that can be equipped flexibly and can accommodate plug-in units with front panels of different widths.

SUMMARY OF THE INVENTION

It is an object of the present invention to provide a shelf with locking elements, which can be positioned freely, in particular locking projections according to the AMC Standard, wherein the installation of these locking elements should be simple and easy to handle for the user.

This and other objects are achieved by the invention, wherein, according to one embodiment, there is provided a shelf for an electronic plug-in unit, comprising: at least one support plate having at least one shaped opening; at least one guide rail arranged for being mounted on the support plate, the guide rail including a guide groove for receiving the electronic plug-in unit; and at least one positioning unit arranged on the guide rail, the positioning unit including: a trunnion insertable form-fittingly into the shaped opening in the support plate to fix a position of the positioning unit relative to the support plate, and a locking element to lock in place an electronic plug-in unit fully inserted into the guide rail.

According to an embodiment of the invention, the locking element does not form an integral component of the support plate or the guide rail, but is arranged on a separate positioning unit. The positioning unit may be coupled with the guide rail, before the guide rail is installed on the support plate. Thus, the positioning unit and the guide rail may be installed together on the support plate, making the installation process simple and easy to handle for the user. Further, since the trunnion is inserted form-fittingly into a shaped opening in the support plate, the position of the locking element on the support plate and the stable anchoring of the positioning unit will conform with the specifications set by the standard.

In one embodiment, the positioning unit material can be selected optionally. Thus, while the guide rail can be formed integrally from a flexible, cheap plastic material, the positioning unit can be produced from a considerably more stable and resistant material such as metal. This feature is advantageous over conventional shelves, in which the entire support rail was made of the same material.

In one embodiment, the locking element is configured as a locking projection conforming to the AMC standard. The positioning unit and the locking projection may be formed from a single piece of metal, e.g., through die-casting or with a forging press, resulting in a locking projection that meets the AMC standard. Such embodiment of the locking projection is considerably more stable than a conventional locking projection formed as an integral component of the support plate.

According to one embodiment of the invention, the guide rail is provided with mounting flanges that can be inserted into corresponding mounting recesses in the support plate and can be secured by shifting the guide rail in the longitudinal direction on the support plate. The positioning unit is arranged so as to be displaceable in longitudinal direction on the guide rail. The mounting flanges preferably have a T-shaped cross section, so that they can grip the support plate in the rear.

For the assembly of the shelf, according to one embodiment of the invention, the guide rail is initially placed onto the top of the support plate, in such a way that at least one of the mounting flanges slides into the corresponding mounting recess. At the same time, the trunnion of the positioning unit can be inserted into the coordinated opening in the support plate. Thereafter, the guide rail is pushed back in the longitudinal direction such that the T-shaped mounting flanges grip the rear part of the support plate, so that the guide rail and the support plate are securely connected to each other. In the meantime, the positioning unit is held in place by the trunnion, and as the guide rail is shifted, it slides by the stationary positioning unit The arrangement of the positioning unit. As a result, the support plate will be connected securely and form-fittingly to the guide rail as well as the positioning unit.

In some embodiments of the invention, a sliding bearing may be arranged on one side of the guide rail, and a ridge may be arranged on the positioning unit. When the guide rail is attached to the positioning unit, the ridge on the positioning unit engages with the sliding bearing to securely hold the positioning unit to the guide rail. In such embodiment, the positioning of the positioning unit in two axial directions can be accomplished with higher precision.

In embodiments of the invention, forces applied to the locking element and/or the locking projection in longitudinal direction are absorbed by the trunnion and carried over the support plate. Thus, the trunnion can be embodied relatively large and solid, while the guide rail and sliding groove can have relatively small dimensions since they only small amount of force is applied to them.

BRIEF DESCRIPTION OF THE DRAWINGS

These and other features and advantages of the invention will be further understood from the following detailed description of the embodiments of the invention with reference to the accompanying drawings, which show in.

DETAILED DESCRIPTION

Figure 1A:
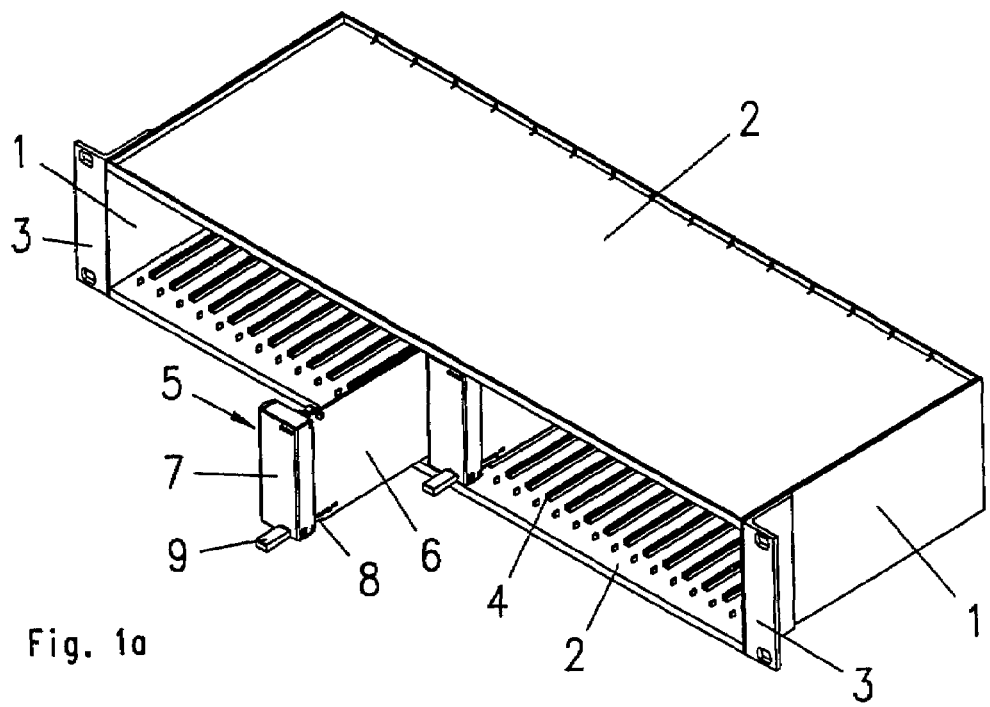
FIG. 1a depicts a simplified, perspective view of a shelf with two plug-in units, according to embodiments of the invention.

FIG. 1a illustrates a shelf device for securely holding plug-in unit such as printed circuit boards according to an embodiment of the present invention. The shelf device illustrated in FIG. 1a is provided with two side walls 1 and two support plates 2, according to an embodiment of the present invention. The support plates 2 are spaced apart at a defined distance by the side walls 1. The side walls 1 may be provided on the left and on the right with mounting flanges 3, which may extend outward to make it possible to install the shelf inside a frame or housing. A number of guide rails 4 may be arranged side-by-side and regularly spaced apart on the lower support plate 2. Identical guide rails 4 may also be arranged on the upper support plate 2, respectively opposite the lower ones.

FIG. 1a shows two exemplary plug-in units 5, of which the right one is completely inserted into the shelf and the left one is pulled halfway out. Each plug-in unit 5 comprises a circuit board 6 for accommodating the electronic elements, a front panel 7 that is attached to the circuit board 6, and a locking mechanism 8 with a locking lever 9 that projects outward in the front.

Figure 1B:
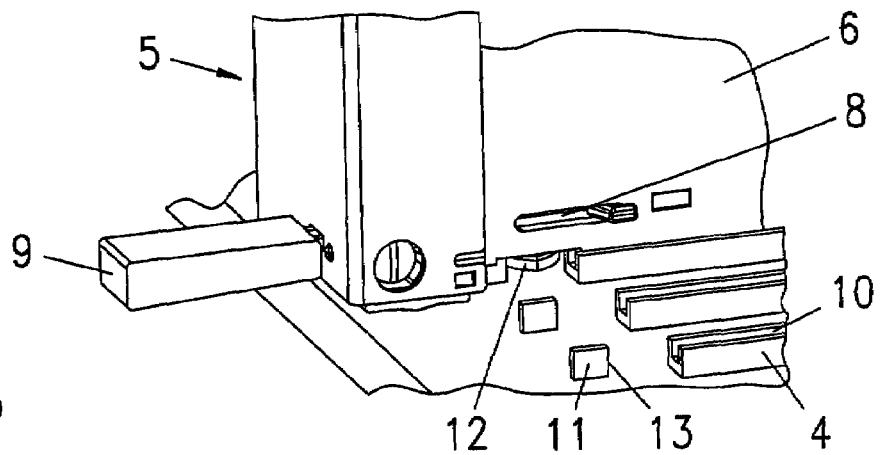
FIG. 1b depicts zoomed-in portion of the shelf shown in FIG. 1a, in which the plug-in unit is fully inserted, according to an embodiment of the invention.

FIG. 1b depicts a zoomed-in portion of the shelf shown in FIG. 1a, in which the plug-in unit 5 is fully inserted, according to an embodiment of the invention. In FIG. 1b, there is depicted a number of guide rails 4 including guide grooves 10 that have an opening on the top and correspond to the edge of the circuit board 6 of the associated plug-in unit 5. The guide groove 10 has a U-shaped cross section and is open in the front of the guide rail 4, so that the circuit board 6 can be readily inserted into guide rail 4 of the shelf.

In the region of the front edge of the support plate 2, small rectangular locking projections 11 may be provided, each respectively assigned to a guide rail 4. The individual locking projections 11 are spaced apart and arranged slightly off-center relative to the guide grooves 10. Dimensions and positions for the guide grooves 10 and the locking projections 11 may be standardized to meet, for example, the aforementioned specifications for AMC and MicroTCA of the PICMG.

The locking projections 11 function to lock in place the completely inserted plug-in units 5. Accordingly, the locking mechanism 8 of the plug-in unit 5 may be provided with a catch 12 that engages a locking edge 13 of the locking projection 11. The locking mechanism 8 may also be provided with a locking lever 9, which can be configured to unlock the interlocking connection between the catch 12 and the locking projection 11.

Figure 1C:
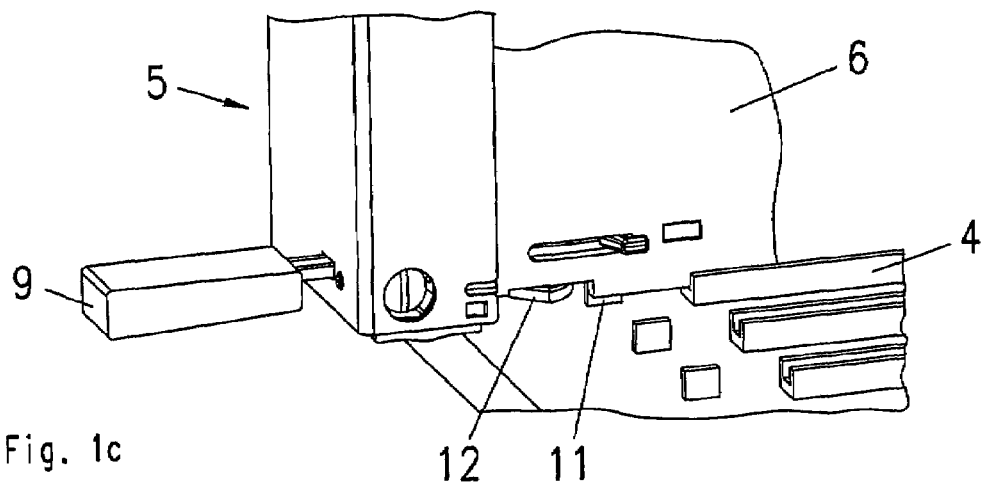
FIG. 1c depicts the shell of FIG. 1b in which the plug-in unit is partially pulled out.

FIG. 1c depicts the plug-in unit 5 slightly pulled out of the guide rail 4, so that the catch 12 is no longer engaged in the locking projection 11.

Figure 2:
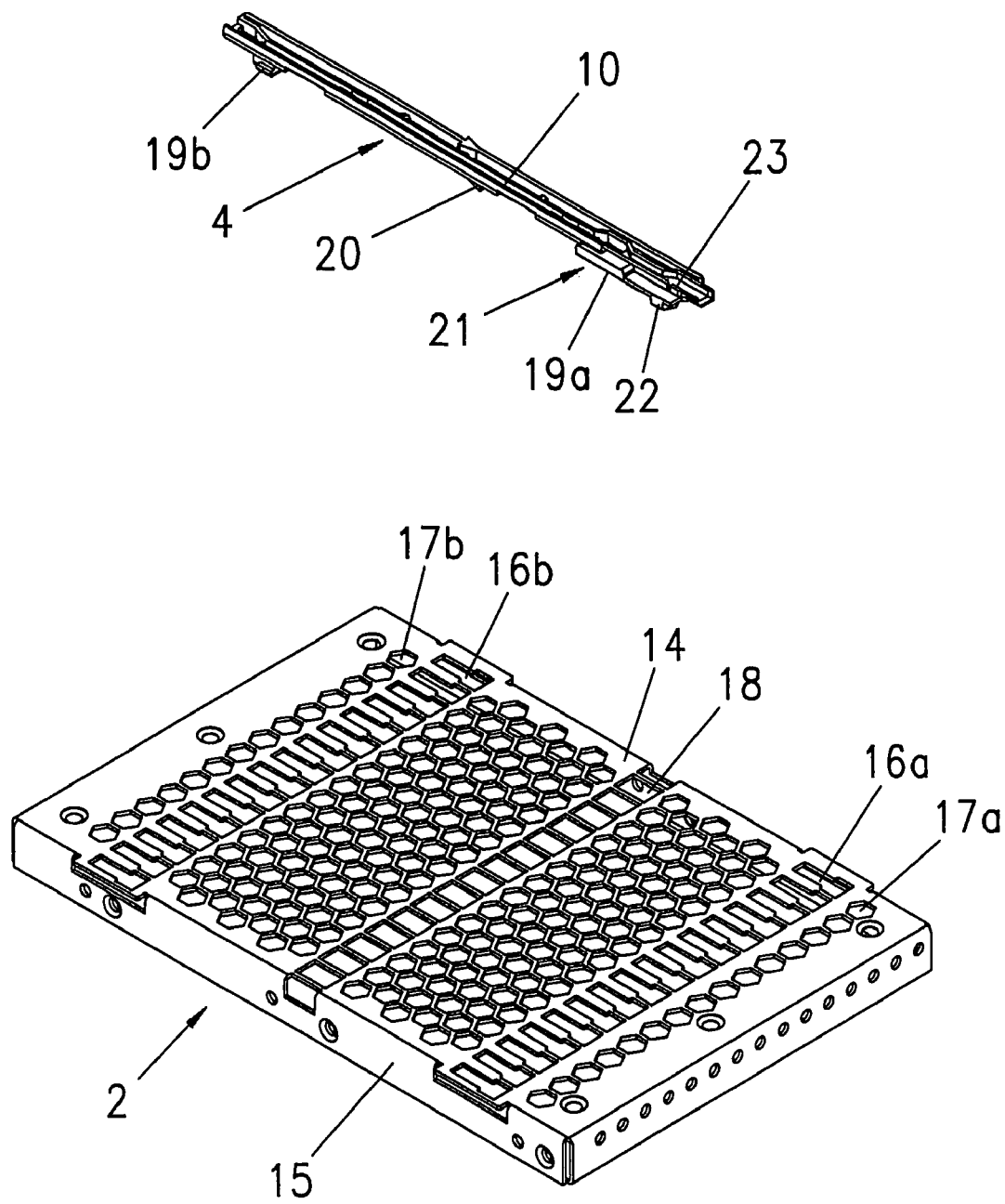
FIG. 2 depicts a single support plate and a guide rail with positioning unit, according to embodiments of the invention.

FIG. 2 depicts a support plate 2, according to an embodiment of the present invention, over which a guide rail 4 can be installed. The support plate 2 consists of a single piece of metal with a surface 14 and beveled edges 15 on the sides. Differently-shaped recesses having predetermined patterns are punched out of the surface 14. As shown in FIG. 2, a first row of frontal mounting recesses 16a may be arranged parallel to the frontal edge of the support plate 2. A second row of identically shaped mounting recesses 16b may be arranged in the region the support plate 2 near its back edge. The mounting recesses 16a and 16b may be shaped in the manner of two adjoining rectangles with different widths. Hexagonally shaped openings 17a and/or 17b may be respectively coordinated with the mounting recesses 16a, 16b. A row of equidistant, rectangular engagement recesses 18 may also be arranged approximately in the center of the support plate 2.

The guide rail 4 may be arranged on the support plate 2 with a front mounting flange 19a and a rear mounting flange 19b, which can be inserted respectively into the front mounting recesses 16a and/or the back mounting recesses 16b of the support plate 2. A small latch hook 20 may also be formed approximately in the center of the guide rail 4, which can snap into an engagement recess 18. The guide rail 4 may be produced primarily from plastic material that is relatively hard, but also elastic and sufficiently resistant to breakage, so that the front portion of the guide rail 4 can be slightly bent.

A small, displaceable positioning unit 21 may be arranged on the front end of the guide rail 4. This positioning unit 21 is provided on the bottom with a trunnion 22 which has a hexagonal cross-section and can be inserted form-fittingly into a corresponding hexagonally-shaped opening 17a in the support plate 2. The positioning unit 21 may also be provided on the top with a locking projection 23, the shape and dimensions of which correspond to the locking projections 11 shown in FIGS. 1*a*-1*c*.

Figure 3A:
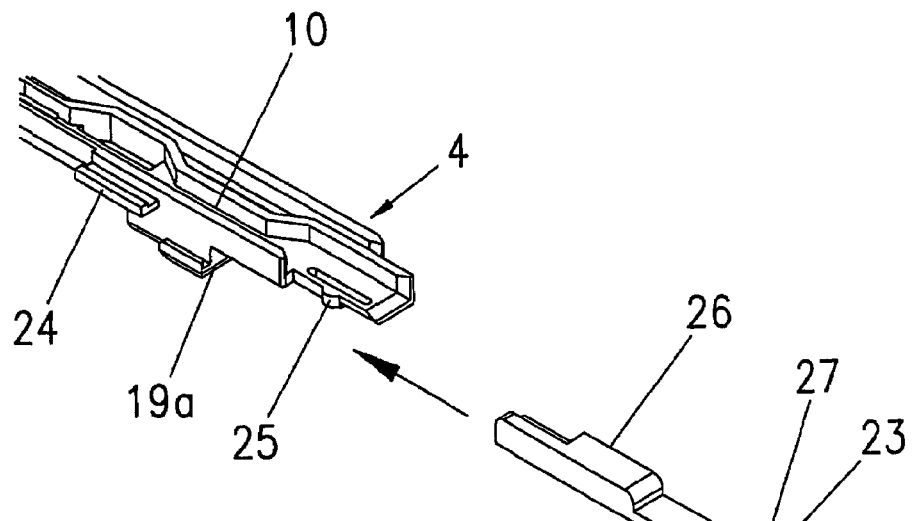
FIG. 3a depicts the zoomed-in portion of the front end of the guide rail and the positioning unit shown in FIG. 2.

FIG. 3*a* depicts the front end of the guide rail 4, as well as a detailed view of the positioning unit 21, according to one embodiment of the present invention. The guide groove 10 of the guide rail 4 has an opening on the top, through which a circuit board 6 may be guided. The guide rail 4 also includes a front mounting flange 19*a* located beneath the guide groove 10, as well as an L-shaped sliding bearing 24 that may be arranged on a side of the guide rail 4. The guide rail 4 may also include a small half-round engagement nose 25 located near the front.

The positioning unit 21 includes a ridge 26 on the side, with which it can be fitted, in direction of the arrow, onto the sliding bearing 24 on the guide rail 4. The positioning unit 21 may also include a locking projection 23, which has a locking edge 27 on its back end, into which a catch 12 (shown in FIGS. 1*b* and 1*c*) can engage.

Figure 3B:
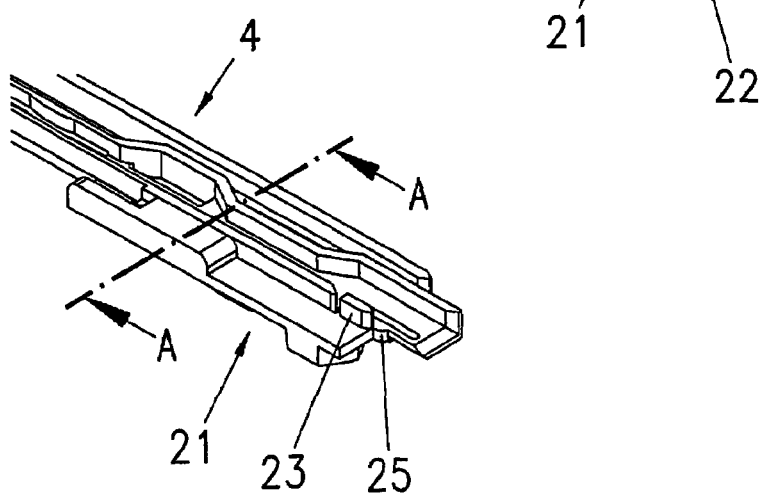
FIG. 3b depicts the front end of the guide rail with fitted-on positioning unit, according to an embodiment of the invention.

FIG. 3*b* depicts a view of the front end of the guide rail 4, and the positioning unit 21, in which the positioning unit 21 is pushed far enough onto the guide rail 4 to allow the pointed front edge of the locking projection 23 to engage behind the latching nose 25 of the guide rail 4, thereby preventing the positioning unit 21 from accidentally slipping off the guide rail 4.

Figure 3C:
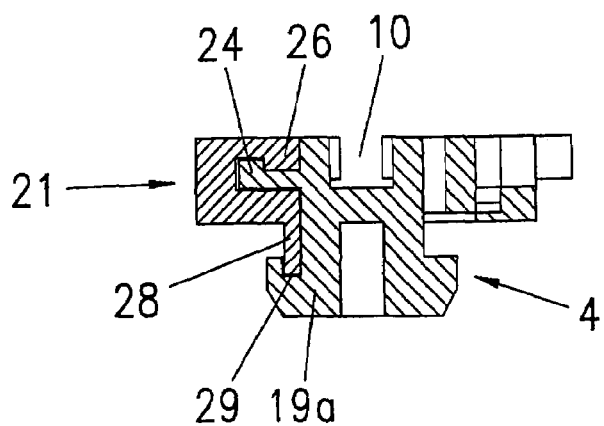
FIG. 3c depicts a cross section along the line A-A in FIG. 3b.

FIG. 3*c* illustrates a cross-section of the positioning unit 21 engaged with the guide rail 4, according to an embodiment of the invention. The sectional view in FIG. 3*c* shows that the positioning unit 21 is arranged so as to be displaceable in longitudinal direction along the guide rail 4. The ridge 26 of the positioning unit 21 may rest on the sliding bearing 24 of the guide rail 4, which, due to its shape, securely holds the ridge 26. The positioning unit 21 may also be include a small sliding flange 28 positioned at the bottom on the positioning unit 21. The sliding flange 28 may engage in a sliding groove 29, which is formed onto the mounting flange 19*a* and is open in the front allowing the sliding flange 28 to slide through.

Referring now to FIGS. 4*a* through 4*d*, the process of attaching a guide rail 19 with pre-mounted positioning unit 21 to a support plate 2 is explained using a three-step mounting process.

Figures 4A, 4B, 4C, 4D:
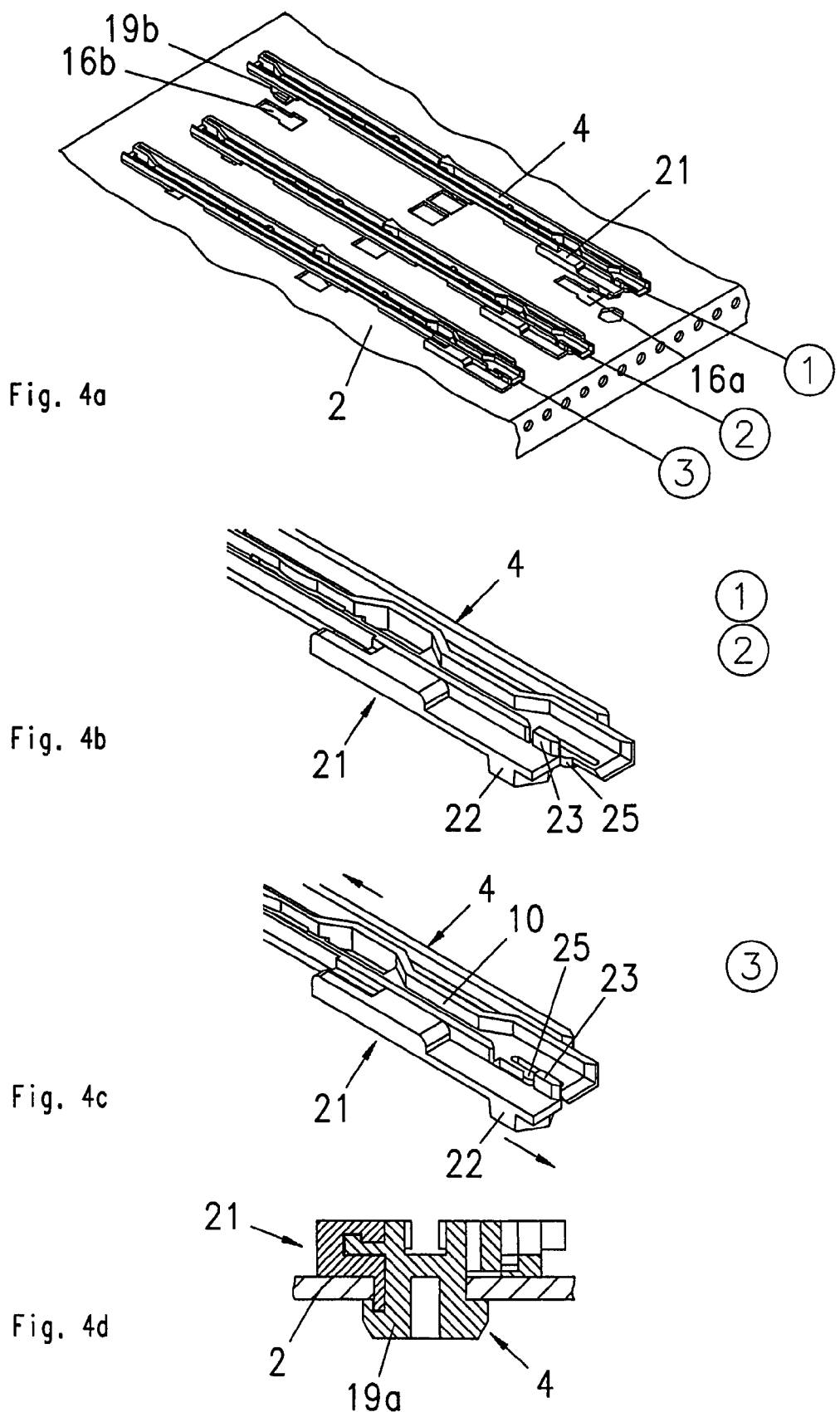
FIGS. 4a-4d depict the fastening of the guide rail and the positioning unit on the support plate, using three mounting steps and shown with three perspective views and one cross-sectional view, according to an embodiment of the invention.

FIG. 4*a* shows three different states for a guide rail 4 with a positioning unit 21 fitted on at the front, according to an embodiment of the invention. In step (1), the guide rail 4 is not yet in contact with the support plate 2. The positioning unit 21 is fitted onto the front end of the guide rail 4 and pushed in as far back as possible. In this position, the locking projection 23 is located behind the latching nose 25, as shown in FIG. 4*b*.

In the following step (2), as shown in FIG. 4*a*, the guide rail 4 and the positioning unit 21 are jointly inserted into the support plate 2, wherein, in one embodiment, the rear mounting flange 19*b* initially slides into a rear mounting recess 16*b*, followed by the front mounting flange 19*a* being inserted into a front mounting recess 16*a*. At the same time, the trunnion 22 of the positioning unit 21 may slide into the shaped opening 17*a* adjacent to the front mounting recess 16*a*.

In the final step (3), as show in FIG. 4*a*, the assembly is completed by pushing the inserted guide rail 4 in longitudinal direction toward the back of the support plate 2, according to an embodiment of the invention. The mounting flanges 19*a* and 19*b* (see FIG. 2) consequently slide back through the mounting recesses 16*a*, 16*b*, until they are stopped by the respective back edges of the mounting recesses 16*a*, 16*b*. In this manner, the T-shaped mounting flanges 19*a*, 19*b* respectively are respectively locked into the support plate 2, as can be seen in the sectional view shown in FIG. 4*d*. As the guide rail 4 is being pushed back, however, the trunnion 22 rests form-fittingly inside the shaped opening 17*a* and secures the positioning unit 21 in its position on the support plate 2, preventing it from sliding back along with the guide rail 4. Since the positioning unit 21, as previously described, is positioned moveable in longitudinal direction on the guide rail 4, as the guide rail 4 is pushed back, it slides by the positioning unit 21. The movement of the guide rail 4 relative to the positioning unit 21 is indicated in FIG. 4*c* by two arrows pointing in opposite directions. A comparison of the FIGS. 4*b* and 4*c* illustrates the change in the relative position prior to (FIG. 4*b*) and following (FIG. 4*c*) the displacement of the guide rail 4. In contrast to FIG. 4*b*, the locking projection 23 of FIG. 4*c* is positioned directly in front of the latching nose 25. In this arrangement, the locking projection 23 is positioned at a defined distance in front of the starting point of the guide groove 10, as specified by the standards previously mentioned.

Figure 5A:
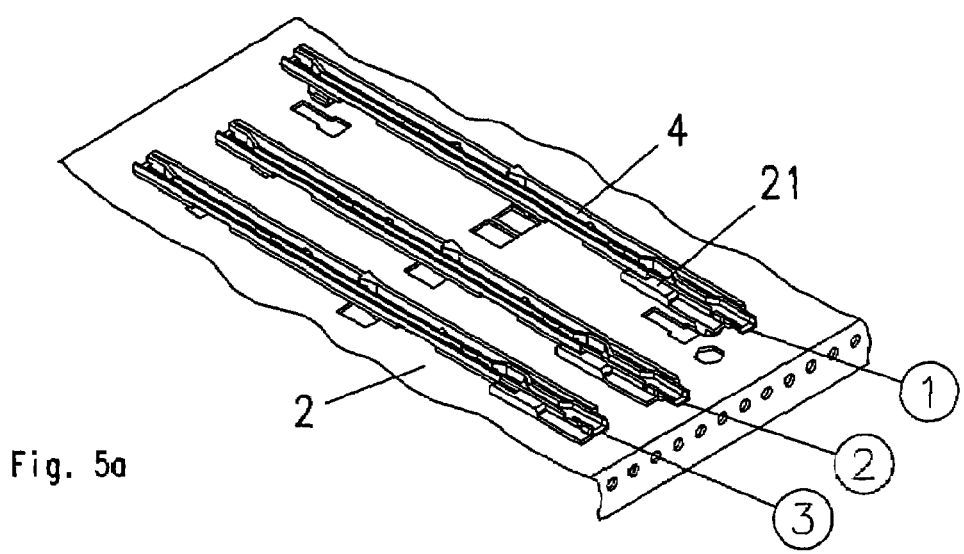
FIGS. 5a-5d depict three longitudinal sectional views showing the three mounting steps, according to an embodiment of the invention.
Figure 5B:
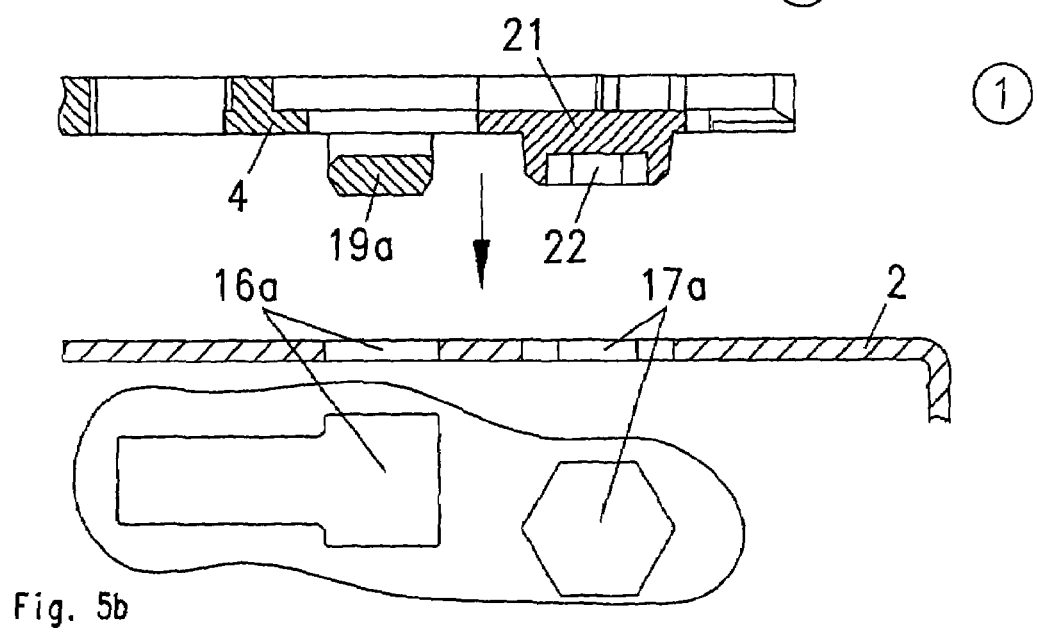
Figure 5C:
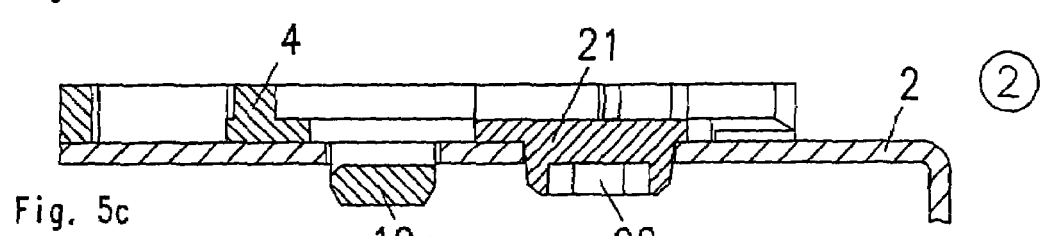
Figure 5D:
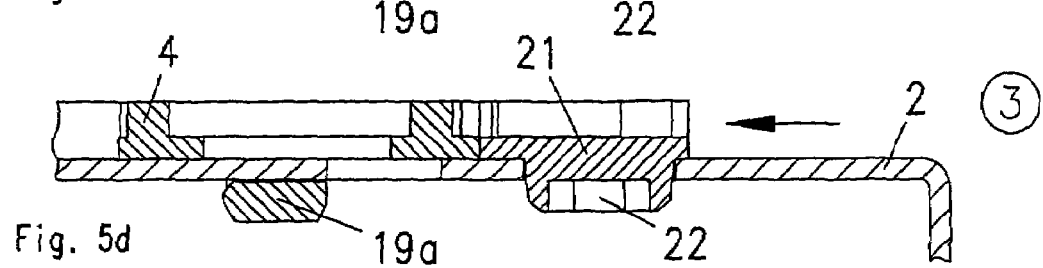

The sectional views in longitudinal direction shown in FIGS. 5*b*, 5*c* and 5*d* again show the different positions of the guide rail 4 and the positioning unit 21, relative to each other and relative to the support plate 2, during the assembly steps (1), (2), and (3).

In FIG. 5*b*, according to an embodiment of the invention, the guide rail 4 with the positioning unit 21 attached thereto is still located above the support plate 2. The positioning unit 21 has been pushed to the very back on the guide rail 4, and the front mounting flange 19*a* of the guide rail 4 and the trunnion 22 of the positioning unit 21 are positioned relatively close to each other. The guide rail 4 and the positioning unit 21 are already oriented such that the mounting flange 19*a* is aligned with the mounting recess 16*a* and the trunnion 22 is aligned with the shaped opening 17*a*.

In FIG. 5*c*, according to an embodiment of the invention, the guide rail 4 and the positioning unit 21 are placed on the top of the support plate 2. The mounting flange 19*a* engages in the mounting recess 16*a* and the trunnion 22 is placed inside the shaped opening 17*a*.

In FIG. 5*d*, according to an embodiment of the invention, the guide rail is shifted in the direction of the arrow. The positioning unit 21 with its trunnion 22 has kept its position on the support plate 2. As a result of the relative movement between guide rail 4 and positioning unit 21, the mounting flange 19*a* of the guide rail 4 has moved away from the trunnion 22. The mounting flange 19*a* subsequently engages behind the support plate 2 in the region of the rear rectangle of the mounting recess 16*a*.

The invention has been described in detail with respect to various embodiments, and it will now be apparent from the foregoing to those skilled in the art, that changes and modifications may be made without departing from the invention in its broader aspects, and the invention, therefore, as defined in the appended claims, is intended to cover all such changes and modifications that fall within the true spirit of the invention.

What is claimed is:

1. A shelf for an electronic plug-in unit, comprising:
   at least one support plate having at least one shaped opening;
   at least one guide rail arranged for being mounted on the support plate, the guide rail including a guide groove for receiving the electronic plug-in unit; and
   at least one positioning unit detachably coupled to the guide rail, wherein the positioning unit comprises a separate bearing block comprised of a more stable and resistant material than the guide rail, and wherein the positioning unit includes: a trunnion inserted form-fittingly into the shaped opening in the support plate to fix a position of the positioning unit relative to the support plate, and a locking element to lock in place an electronic plug-in unit fully inserted into the guide rail.

2. The shelf according to claim 1, wherein the locking element includes a locking projection having a locking edge.

3. The shelf according to claim 1, wherein the support plate includes at least one mounting recess arranged in a pattern and the guide rail comprises at least one mounting flange insertable into a corresponding mounting recess of the support plate, wherein the guide rail and positioning unit are arranged to be moveable relative to one another in a longitudinal direction of the guide rail, and the corresponding mounting recess into which the mounting flange is insertable is shaped to make a form locking connection with the mounting flange by shifting the guide rail relative to the positioning unit.

4. The shelf according to claim 3, wherein the at least one mounting flange has a T-shaped cross-section such that, when the guide rail is shifted in the longitudinal direction on the support plate, the mounting flange embraces the back side of the support plate.

5. The shelf according to claim 1, wherein the positioning unit comprises metal.

6. The shelf according to claim 3, wherein the guide rail further comprises a latching nose, the locking element engages the latching nose to hold the guide rail in place when the guide rail is shifted in the longitudinal direction.

7. A shelf for an electronic plug-in unit, comprising:
at least one support plate having at least one shaped opening;
at least one guide rail arranged for being mounted on the support plate, the guide rail including a guide groove for receiving the electronic plug-in unit; and
at least one positioning unit arranged on the guide rail, the positioning unit including: a trunnion insertable form-fittingly into the shaped opening in the support plate to fix a position of the positioning unit relative to the support plate, and a locking element to lock in place an electronic plug-in unit fully inserted into the guide rail,
wherein the guide rail has a side including a sliding bearing and the positioning unit comprises a ridge that is slidably guided inside the sliding bearing so that the guide rail and positioning unit are moveable relative to one another in a longitudinal direction of the guide rail.

* * * * *